United States Patent
Ioki et al.

(10) Patent No.: US 8,208,256 B2
(45) Date of Patent: Jun. 26, 2012

(54) DISPLAY DEVICE

(75) Inventors: Kazuhiro Ioki, Tokyo (JP); Shoji Mori, Tokyo (JP); Yoshimi Iwasaki, Tokyo (JP); Koji Kise, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 267 days.

(21) Appl. No.: 12/674,009

(22) PCT Filed: Aug. 20, 2007

(86) PCT No.: PCT/JP2007/066115
§ 371 (c)(1),
(2), (4) Date: Feb. 18, 2010

(87) PCT Pub. No.: WO2009/025025
PCT Pub. Date: Feb. 26, 2009

(65) Prior Publication Data
US 2011/0026224 A1 Feb. 3, 2011

(51) Int. Cl.
*H05K 7/20* (2006.01)
*H01J 61/52* (2006.01)
*G09G 3/20* (2006.01)
*G09G 5/10* (2006.01)
*G09G 3/36* (2006.01)
*F21V 8/00* (2006.01)
*F21V 29/00* (2006.01)

(52) U.S. Cl. ............. 361/695; 313/46; 345/55; 345/87; 345/690; 345/905; 362/612; 362/613

(58) Field of Classification Search .................. None
See application file for complete search history.

(56) References Cited

U.S. PATENT DOCUMENTS

| 4,277,816 | A | | 7/1981 | Dunn et al. |
| 4,296,455 | A | | 10/1981 | Leaycraft et al. |
| 4,851,965 | A | | 7/1989 | Gabuzda et al. |
| 5,869,919 | A | * | 2/1999 | Sato et al. ................ 313/17 |
| 6,043,979 | A | * | 3/2000 | Shim ....................... 361/695 |
| 6,154,362 | A | | 11/2000 | Takahashi et al. |
| 6,882,108 | B2 | * | 4/2005 | Kim et al. ................ 313/582 |
| 7,269,009 | B2 | * | 9/2007 | Ryu et al. ................ 361/692 |
| 7,508,655 | B2 | * | 3/2009 | Baek ........................ 349/56 |
| 2003/0043091 | A1 | | 3/2003 | Takeuchi et al. |
| 2004/0196628 | A1 | * | 10/2004 | Hisano et al. ............ 361/689 |
| 2006/0232919 | A1 | * | 10/2006 | Jeong ...................... 361/681 |
| 2007/0279930 | A1 | * | 12/2007 | Aoki et al. .............. 362/561 |
| 2008/0170015 | A1 | * | 7/2008 | Kise et al. .............. 345/82 |
| 2009/0009047 | A1 | * | 1/2009 | Yanagawa et al. ....... 313/46 |

FOREIGN PATENT DOCUMENTS

EP          0 991 050          4/2000
(Continued)

OTHER PUBLICATIONS

International Search Report (PCT/ISA/210) for PCT/JP2007/066115 mailed Sep. 18, 2007.

*Primary Examiner* — Gregory Thompson
(74) *Attorney, Agent, or Firm* — Buchanan Ingersoll & Rooney PC

(57) ABSTRACT

An air duct plate is provided on the back of a substrate on the surface of which a light emitting element group for display as well as an integrated circuit are disposed. A fan acts to send air into a space surrounded by a case body extending over and around the air duct plate and the air duct plate. A plurality of openings acting to blow a cooling air generated by the fan to a predetermined portion of the substrate are formed in the air duct plate.

14 Claims, 2 Drawing Sheets

FOREIGN PATENT DOCUMENTS

| | | |
|---|---|---|
| EP | 1 441 581 | 7/2004 |
| JP | 55-158655 A | 12/1980 |
| JP | 63-036290 A | 2/1988 |
| JP | 4-055087 U | 5/1992 |
| JP | 09-116286 A | 5/1997 |
| JP | 10-293540 A | 11/1998 |
| JP | 11-231808 A | 8/1999 |
| JP | 2000-356956 A | 12/2000 |
| JP | 2003-076286 A | 3/2003 |

* cited by examiner

DISPLAY DEVICE

TECHNICAL FIELD

The present invention relates to a display device causing a light emitting element group to emit light to make a display and, more particularly, to a display device that can suppress the rise of temperature resulted from heat generation accompanied by light emission of a light emitting element group as well as temperature distribution.

BACKGROUND ART

Recently, display devices using a plasma display, a liquid crystal display, a field emission display and the like including a light emitting diode (hereinafter, it is abbreviated as LED (Light Emitting Diode)) have been generally known and have been widely employed together with those using a conventional CRT (Cathode Ray Tube), a discharge tube or the like, or in substitution for them.

However, in these display devices, a conversion efficiency of light is low, and, for example, as to LED elements, it is about 10% and most supplied power is to be converted to heat. Furthermore, the rise in temperature of the above-mentioned elements further decreases the conversion efficiency of light, thus to be the cause of reduction in reliability of elements and uneven brightness. In particular, in the case that elements of displaying colors (for example, elements of displaying a red color, blue color and green color) have different light conversion efficiencies, this fact is to be a primary factor of generation of irregular colors, and a problem exits in, e.g., the reduction in quality of images.

In the case of a display device using a light emitting element such as LED element, being different from the one that uses a normal CRT and the like, light emitting sources, that is, light emitting elements of which temperatures should be uniform are arranged normally at regular intervals on the entire surface of a display device. In addition, integrated circuits, for example, a driver IC, a logic IC, an FET, and a clock IC necessary for controlling the light emission of LED elements are a source of heat generation. Since these integrated circuits are disposed on a substrate avoiding an LED element, an interface, a capacitor and the like, they cannot be arranged at regular intervals, which will be the factor of generation of temperature distribution between the LED elements.

Therefore, it is required to suppress the rise in temperature of the elements and the temperature distribution between the elements with the use of some cooling unit. Conventionally, to cope with this, an attempt has been proposed, and in which a ventilation hole is formed in a display panel part that is provided to mold the LED so as to get through from its front face to its back face; as well as a cooling air having been taken in from outside using a fan cools a cell substrate functioning to drive the LED, and thereafter the cooling air is sent to the front face on the display panel side through the above-mentioned ventilation path, whereby heat having been radiated from the display cell is discharged to the outside. (For Example, Refer to Patent Document 1.)

In addition, another cooling system of a display has been proposed, and in which a partition plate is disposed in the proximity of the back of a light guide, whereby a channel of fluid that is adjacent to the back of the light guide is formed. (For example, refer to Patent Document 2.)

Patent Document 1: Japanese Patent Publication (unexamined) No. 293540/1998

Patent Document 2: Japanese Patent Publication (unexamined) No. 76286/2003

DISCLOSURE OF INVENTION

Problems to be Solved by the Invention

In the display device disclosed in the mentioned Patent Document 1, as described above, since a cell substrate functioning to drive an LED is different from an LED mount substrate, it is certain that there is no influence of temperature distribution as a result of heat generation of the LED drive elements, but a plurality of substrates results in the increase in cost. Moreover, since a ventilation hole is formed so as to get through a display unit from front face to back face, it is certain that a cooling capacity with respect to a substrate is surely improved to some extent, but a ventilation hole needs to be formed in the display unit, resulting in increased manufacturing cost and exceedingly complicated structure. Furthermore, since a mold member is disposed between an LED mount substrate and a cooling air passing through the ventilation hole, to act as a thermal resistance, resulting in less cooling efficiency than it should be.

In addition, in the cooling system of the display disclosed in mentioned Patent Document 2, an outside air that has been sucked using a pumping fan just flows upwards in a cooling chamber defined by a partition wall. Thus, it is certain that the back of a light guide can be cooled, but in the case that a heat generation part such as an integrated circuit is disposed at a specified portion on a substrate, uniform temperature distribution cannot be achieved.

The present invention was made in view of the mentioned technical problems, and has a basic object of providing a display device using a light emitting element capable of cooling a substrate where light emitting elements are arranged comparatively uniformly as well as efficiently without incurring excessive rise in cost and complicated structure.

Means of Solution to the Problem

A display device according to the invention includes: a substrate on the surface of which a light emitting element group for display as well as an integrated circuit are disposed; an air duct plate disposed on the backside of the mentioned substrate at a predetermined distance from the substrate; a case body extending over and around the mentioned air duct plate; and a fan sending an air into a space that is surrounded by the mentioned case body and air duct plate, in which a plurality of openings acting to blow a cooling air having been generated by the mentioned fan to a predetermined portion on the side of the mentioned substrate are formed in the mentioned air duct plate.

ADVANTAGES OF THE INVENTION

According to the invention, a cooling air having been sent by the fan into the space that is surrounded by the case body and the air duct plate can be made to pass through the openings formed in the air duct plate in a region covered with the case body to be blown to the substrate. At the point to which this cooling air has been blown, the cooling efficiency is locally increased. Therefore, by forming each opening at a position corresponding to a local heat generation source (integrated circuit) or to a region of stagnation of a cooling air (e.g., axial center of fan), temperature distribution can be reduced.

As a result, a light emitting element group and an integrated circuit on the substrate can be cooled efficiently as well as uniformly, and thus it is possible to obtain a highly reliable display device of less uneven brightness and irregular colors.

In this manner, a comparatively simple construction of just providing an air duct plate provided with openings between the substrate and the fan is sufficient, so that there is no need of excessively complicated structure or rise in cost as in the prior arts.

BEST MODE FOR CARRYING OUT THE INVENTION

Embodiment 1

Figure 1:
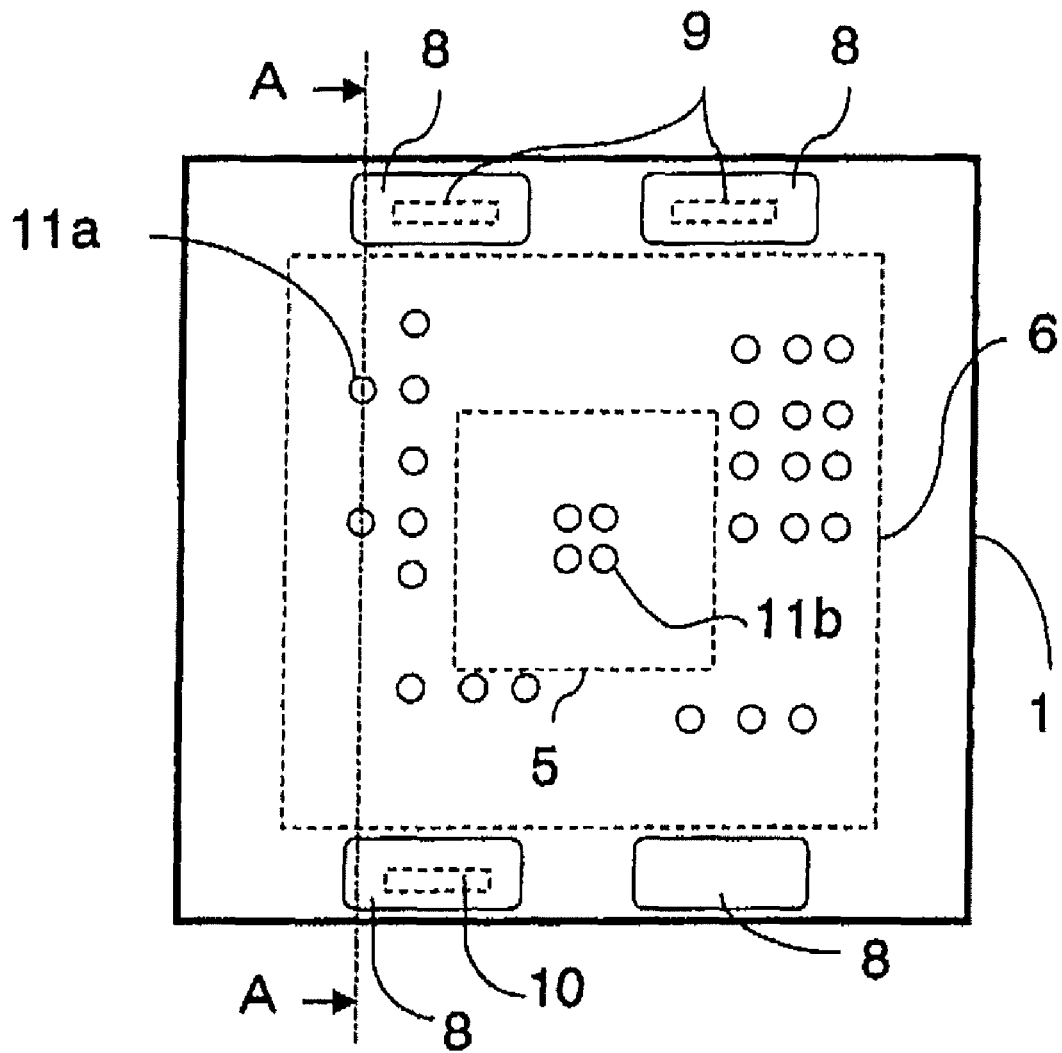
FIG. 1 is a schematic diagram of an air duct plate in a display device according to a first embodiment of the present invention.
Figure 2:
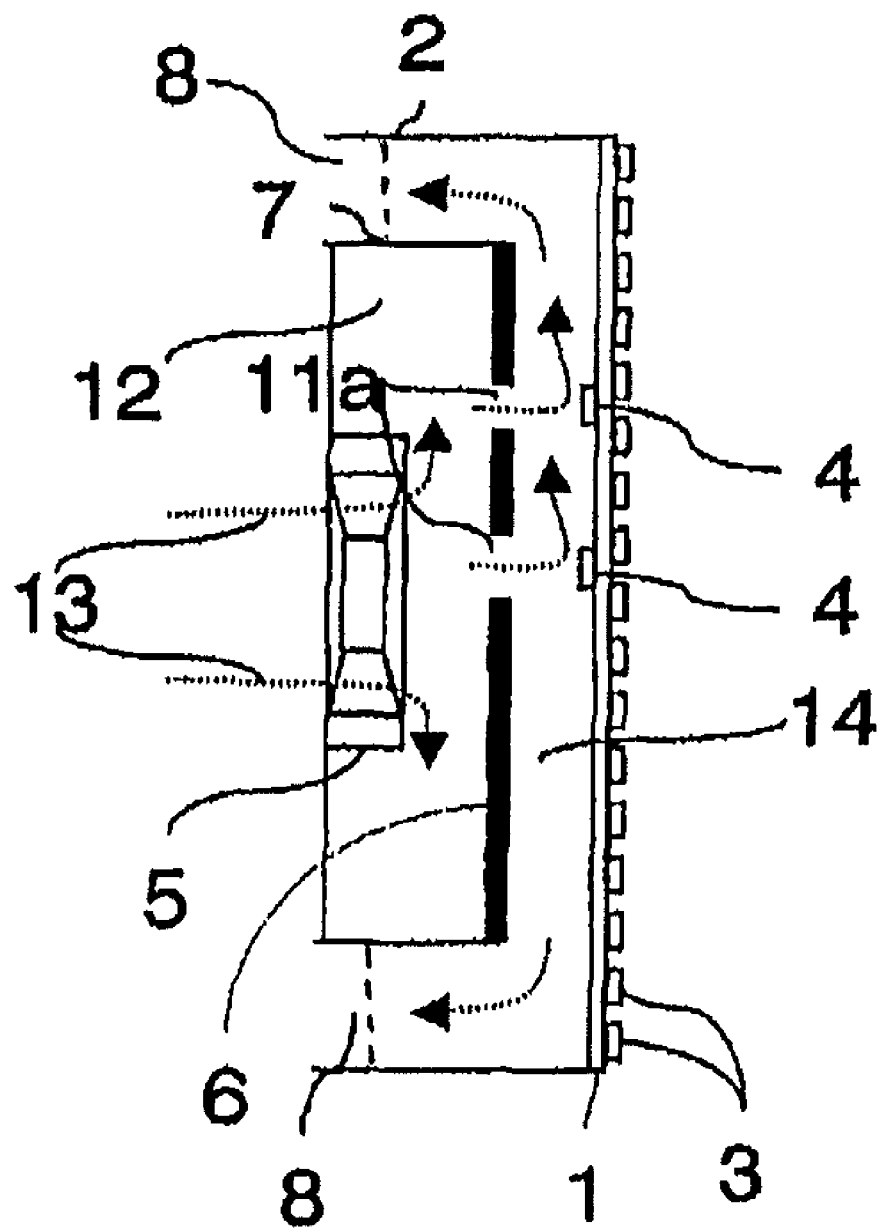
FIG. 2 is a sectional view of a display device according to a first embodiment of the present invention.

A preferred embodiment according to the present invention is hereinafter described in detail referring to the accompanying drawings. FIG. 1 is a schematic diagram of a display device according to a first embodiment of the present invention viewed from backside. And FIG. 2 is a diagram schematically illustrating a cross section taken along the line A-A of FIG. 1. A plurality of such display units as illustrated in the drawings are arranged lengthwise and crosswise to form a display device of a large screen as a whole. Incidentally, although in FIG. 2, there is no fan present in the cross section taken along the line A-A, for reasons of convenience of explanation, it is illustrated at a position being projected on the cross section taken along the line A-A.

In the drawings, reference numeral 1 designates a substrate supported by a substrate support 2 on the surface side of a display device, numeral 3 designates, for example, an LED element group of a plurality of LED elements arranged lengthwise and crosswise on the surface of the above-mentioned substrate 1, numeral 4 designates an integrated circuit that is likewise disposed on the back of the above-mentioned substrate 1 and that makes, e.g., a drive control of the above-mentioned LED element 3, numeral 5 designates a fan that is disposed on a back of an air duct plate 6. The air duct plate 6 is disposed in a space between the above-mentioned substrate 1 and the fan 5 at a predetermined distance from mentioned substrate, numeral 7 designates a case body extending over and around the above-mentioned air duct plate 6, numeral 8 designates a cooling air outlet, and numerals 9 and 10 designate interface connectors that are formed on the substrate 1 and connected to an external power source and an external controller via the above-mentioned cooling air outlet 8, and in which numeral 9 is a power source interface connector and numeral 10 is a controlling interface connector. Numerals 11a and 11b designate openings formed in the above-mentioned air duct plate 6, and in which numeral 11a is an opening formed, for example, above the integrated circuit 4 and numeral 11b is an opening formed right below the above-mentioned fan 5 respectively.

The amount of heat generation at the substrate 1 is a superposed amount of the heat generation to be generated from the LED element group 3 that is arranged at regular intervals and the heat generation to be generated locally at the integrated circuit 4 and the like. Accordingly, it is necessary to cool the entire substrate 1 and to locally increase the cooling efficiency in the region of the integrated circuit 4 and the like. Incidentally, although the air duct plate 6 is attached to the substrate support 2 via the case body 7 in the above-mentioned embodiment, it is possible to form an integral structure of the air duct plate 6 and the case body 7. Furthermore, the cooling air outlet 8 is fabricated by forming the openings in the air duct plate 6, thus achieving a simple structure.

In the above-mentioned construction, a cooling air 13 having been sent into a space 12 that is surrounded by the case body 7 and the air duct plate 6 using the fan 5 is blown to the substrate 1 where the LED element group 3 is arranged at regular intervals through the openings 11a, 11b formed in the air duct plate 6, and thereafter passes through an air flow path 14 that is formed between the substrate 1 and the air duct plate 6 to be discharged from the cooling air outlet 8 to the outside.

In this embodiment, the opening 11a is formed at a position corresponding to the integrated circuit of the substrate. The cooling air 13 is blown through the opening 11a to the integrated circuit 4 that is disposed on the substrate 1 and the peripheral portion of the substrate. Since cooling efficiency is improved at the points where the cooling air 13 is impinged on the substrate, the cooling efficiency in regions of the integrated circuit 4 and the like can be locally increased. In addition, the cooling air 13 having been blown passes through the air flow path 14 between the substrate 1 and the air duct plate 6 to be discharged from the cooling air outlet 8, so that the entire substrate 1 can be cooled. Thus, by properly adjusting the position and the size of the openings 11a, 11b, the temperature distribution on the substrate is reduced to a minimum as well as higher cooling efficiency on the substrate 1 can be achieved.

Further, in this embodiment, at a position corresponding to the center portion of the fan 5, the opening 11b of the air duct plate is formed. In the axial flow fan 5, no air flows in its axial portion, and therefore the portion right below the axis of the fan 5 becomes a stagnation point. On the other hand, since the LED element group 3 is arranged at regular intervals on the substrate 1, the portion right below the fan needs to be cooled.

Owing to the construction illustrated in this embodiment and by properly adjusting the size of the openings 11, an internal pressure in the space 12 covered with the case body 7 and the air duct plate 6 can be increased, and thus the cooling air 13 can be made to pass through the opening 11. Incidentally, since the volume of air is decreased as the internal pressure is increased, the size of the openings 11 needs to be properly adjusted.

Furthermore, for example, there are some cases that a capacitor and the like, of which heat generation is relatively small but which is an obstacle to the flow of cooling air, are disposed on the substrate 1, whereby the stagnation of an air flow is generated and a temperature locally rises. Even in such cases, by provision of an opening above the stagnation point of an air flow, a cooling air is allowed to flow in the stagnation region, and uniform temperature distribution can be achieved.

Further, in this embodiment, the size of the opening 11a of the air duct plate in the region covered with the case body 7 is made to be larger than that of the integrated circuit 4 of the substrate 1 to cool the substrate at the peripheral portion of the integrated circuit 4. Since most heat having been generated at the integrated circuit is radiated from the substrate via a lead, a cooling air is not blown to a case (frame) of the integrated circuit, but to the substrate at the peripheral portion of the integrated circuit, whereby the cooling efficiency is locally increased. In addition, although the integrated circuit 4 is generally shaped to be rectangular, in view of easy machining, it is shaped to be circular in this embodiment.

As described above, according to the embodiment of the invention, the position of the openings 11a, 11b to be formed in the air duct plate 6 can be arbitrarily selected, so that it is possible to design an air flow path without restraints in accordance with the elements arranged on the substrate 1 to be used. Furthermore, points of local heat generation can be cooled using impinging jets of high cooling efficiency, and thus it is possible to uniform the temperature distribution on the substrate, that is, the temperature distribution of the LED elements. Consequently, it comes to be possible to manufacture a display device having high reliability and high image quality of low color irregularities without excessively complicated structure and rise in cost.

The invention claimed is:

1. A display device comprising:
   a substrate including surfaces on which a light emitting element group for display as well as an integrated circuit are disposed;
   an air duct plate disposed on the backside of said substrate at a predetermined distance from the substrate;
   a case body extending over and around said air duct plate; and
   a fan sending air into a space that is surrounded by said case body and air duct plate,
   wherein a plurality of openings acting to blow cooling air generated by said fan to a predetermined portion of said substrate are formed in said air duct plate.

2. The display device according to claim 1, wherein said air duct plate openings are formed at positions corresponding to an integrated circuit of the substrate.

3. The display device according to claim 1, wherein said air duct plate openings are formed at positions corresponding to a center portion of the fan.

4. The display device according to claim 1, wherein size of said air duct plate openings is larger than that of the integrated circuit of the substrate.

5. The display device according to claim 1, wherein said air duct plate openings have a circular shape.

6. A display device comprising:
   a substrate on which a light emitting element group for display as well as an integrated circuit are disposed;
   an air duct plate disposed on a backside of said substrate at a predetermined distance from the substrate;
   a case body covering at least a part of said air duct plate; and
   a fan that is disposed on a back of said air duct plate to send air into a space surrounded by said case body and air duct plate,
   wherein a plurality of openings acting to blow cooling air generated by said fan to a predetermined portion of said substrate are formed in said air duct plate; and
   wherein said cooling air having impinged on the back of said air duct plate through said fan is made to pass through said openings to be blown to said substrate, and thereafter discharged from the back of said air duct plate.

7. The display device according to claim 6, wherein at least a part of said air duct plate openings is formed at a position corresponding to an integrated circuit of the substrate.

8. The display device according to claim 6, wherein size of said air duct plate openings is larger than that of the integrated circuit of the substrate.

9. The display device according to claim 6, wherein said air duct plate openings have a circular shape.

10. The display device according to claim 7, wherein the size of said air duct plate openings is larger than that of the integrated circuit of the substrate.

11. The display device according to claim 7, wherein said air duct plate openings have a circular shape.

12. A display device comprising:
    a substrate on which a light emitting element group for display as well as an integrated circuit are disposed;
    an air duct plate disposed on a backside of said substrate at a predetermined distance from the substrate;
    a case body covering at least a part of said air duct plate; and
    a fan that is disposed on a back of said air duct plate to send air into a space surrounded by said case body and air duct plate,
    wherein a plurality of openings acting to blow cooling air generated by said fan to a predetermined portion of said substrate are formed in said air duct plate; and
    wherein at least a part of said air duct plate openings is formed at a position corresponding to a center portion of the fan.

13. The display device according to claim 12, wherein the size of said air duct plate openings is larger than that of the integrated circuit of the substrate.

14. The display device according to claim 12, wherein said air duct plate openings have a circular shape.

* * * * *